(12) United States Patent
Koga et al.

(10) Patent No.: US 8,302,277 B2
(45) Date of Patent: Nov. 6, 2012

(54) MODULE AND MANUFACTURING METHOD THEREOF

(75) Inventors: Akihiro Koga, Kyoto (JP); Shigenori Makino, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 597 days.

(21) Appl. No.: 12/262,278

(22) Filed: Oct. 31, 2008

(65) Prior Publication Data

US 2009/0133904 A1 May 28, 2009

(30) Foreign Application Priority Data

Nov. 2, 2007 (JP) ................. 2007-285976

(51) Int. Cl.
*B23P 17/00* (2006.01)
*H05K 3/36* (2006.01)
*H05K 3/30* (2006.01)
*H05K 13/00* (2006.01)

(52) U.S. Cl. .......... 29/417; 29/412; 29/830; 29/832; 29/841; 29/855

(58) Field of Classification Search .......... 174/258, 174/260, 251; 361/760, 795, 761; 257/692, 257/724, 700, 703, 705, 723; 29/412, 417, 29/830, 832, 841, 855
See application file for complete search history.

(56) References Cited

U.S. PATENT DOCUMENTS

| | | | |
|---|---|---|---|
| 4,621,066 A * | 11/1986 | Nishigaki et al. | 501/128 |
| 5,870,289 A * | 2/1999 | Tokuda et al. | 361/779 |
| 6,207,477 B1 * | 3/2001 | Motooka et al. | 438/113 |
| 6,333,564 B1 * | 12/2001 | Katoh et al. | 257/780 |
| 6,507,092 B1 * | 1/2003 | Fukasawa et al. | 257/620 |
| 6,607,970 B1 | 8/2003 | Wakabayashi | |
| 7,727,875 B2 * | 6/2010 | Shin et al. | 438/613 |
| 2003/0184985 A1 | 10/2003 | Oshima et al. | |
| 2004/0166763 A1 * | 8/2004 | Hanada et al. | 445/51 |
| 2004/0227258 A1 * | 11/2004 | Nakatani | 257/787 |
| 2005/0104204 A1 * | 5/2005 | Kawakubo et al. | 257/724 |
| 2005/0263880 A1 * | 12/2005 | Igarashi et al. | 257/723 |
| 2005/0269681 A1 * | 12/2005 | Asahi et al. | 257/686 |
| 2006/0183349 A1 * | 8/2006 | Farnworth et al. | 438/792 |
| 2006/0234023 A1 * | 10/2006 | Endou et al. | 428/210 |

(Continued)

FOREIGN PATENT DOCUMENTS

JP 2001-24312 1/2001

(Continued)

OTHER PUBLICATIONS

Machine Translation of JP 2002-164658A: Ueda, Jun, Module Board, Jun. 2002.*

*Primary Examiner* — Timothy Thompson
*Assistant Examiner* — Sherman Ng
(74) *Attorney, Agent, or Firm* — Fish & Richardson P.C.

(57) ABSTRACT

A method of manufacturing a module is provided that can alleviate a decrease in cutting yield. This method includes: a step of mounting, on a wiring board having a plurality of mounting regions enclosed by cutting lines on its upper surface, an electronic component in each of the mounting regions; a step of cutting the wiring board along the cutting lines; a step of forming a sealing resin layer so as to seal the electronic component to cover at least part of upper and side surfaces of the cut wiring board; and a step of cutting the sealing resin layer along cut portions (cutting lines) of the cut wiring board.

7 Claims, 7 Drawing Sheets

U.S. PATENT DOCUMENTS

| | | | |
|---|---|---|---|
| 2007/0134846 A1* | 6/2007 | Takahashi et al. | 438/113 |
| 2007/0166867 A1* | 7/2007 | Chow et al. | 438/65 |
| 2007/0267736 A1* | 11/2007 | Shimanuki | 257/692 |
| 2008/0074829 A1* | 3/2008 | Kashiwazaki | 361/600 |

FOREIGN PATENT DOCUMENTS

| | | |
|---|---|---|
| JP | 2001-144121 | 5/2001 |
| JP | 2002-164658 | 6/2002 |
| JP | 2002164658 A * | 6/2002 |
| JP | 2003-243571 | 8/2003 |
| JP | 2005-159183 | 6/2005 |
| JP | 2005-333047 | 12/2005 |
| JP | 2006-41071 | 2/2006 |
| JP | 2006-192753 | 7/2006 |
| JP | 2006-352076 | 12/2006 |
| JP | 2007-227726 | 9/2007 |

* cited by examiner

MODULE AND MANUFACTURING METHOD THEREOF

This application is based on Japanese Patent Application No. 2007-285976 filed on Nov. 2, 2007, the contents of which are hereby incorporated by reference.

BACKGROUND OF THE INVENTION

1. Field of the Invention

The present invention relates to a module having electronic components mounted thereon and a method of manufacturing the same.

2. Description of Related Art

Conventionally, there are known module substrates (modules), on which electronic components such as resistors and capacitors are mounted and which are used as a kind of integrated circuit. Such module substrates are mounted on wiring boards with other semiconductor devices and the like, and are incorporated in electronic devices. In these days, owing to the weight reduction of electronic devices, there is a demand for compact module substrates for use with such electronic devices. For this reason, as a method of manufacturing module substrates, from the viewpoint of easy handling in small sizes, conventionally, a method is employed with which a plurality of modules are formed on a same board, followed by division of the board into each module to obtain a plurality of module substrates at once.

A specific method of manufacturing a module substrate as described above proceeds as follows: first, on a board with predetermined wiring patterns formed thereon, electronic components are mounted so as to fit the corresponding wiring patterns; next, substantially the whole upper surface of the board is coated with a sealing resin layer such that the mounted electronic components are sealed; and then, the sealing resin layer and the board are cut with a dicing saw such that the board with the sealing resin layer formed thereon is divided into each module. In this way, a plurality of module substrates can be obtained. Such methods of manufacturing module substrates (modules) are disclosed, for example, in Japanese Unexamined Patent Application No. 2002-164658.

The conventional manufacturing method described above, however, suffers from a problem where the board warps, at the time of coating of the upper surface of the board with the sealing resin layer, due to contraction or expansion of the sealing resin layer during the hardening thereof and for other causes. The warp that has thus developed in the board makes it difficult to cut the board into each module. This leads to a problem of a decrease in cutting yield.

SUMMARY OF THE INVENTION

The present invention has been devised to solve the above problems, and it is an object of the invention to provide a method of manufacturing a module that can alleviate a decrease in cutting yield.

Another object of the invention is to provide a module that has satisfactory cut surfaces and that has a reduced warp in a ceramics substrate.

To achieve the above objects, a method of manufacturing a module according to a first aspect of the invention includes a step of mounting, on a ceramics substrate having on an upper surface thereof a plurality of mounting regions enclosed by cutting lines, an electronic component in each of the mounting regions, a step of cutting the ceramics substrate along the cutting lines, a step of forming a sealing resin layer so as to seal the electronic component and to cover at least part of upper and side surfaces of the cut ceramics substrate, and a step of cutting the sealing resin layer along the cut portions of the cut ceramics substrate.

With the method of manufacturing a module according to the first aspect of the invention, as described above, electronic components are mounted in the mounting regions on the ceramics substrate, and the ceramics substrate is cut along the cutting lines, and then the sealing resin layer is formed such that it covers part of the upper and sides surfaces of the cut ceramics substrate. Thus, even if, when the sealing resin layer is hardened, the contraction (or the expansion) or the like of the sealing resin layer causes stress to act on the ceramics substrate, the warp resulting from the stress can be distributed among the cut-apart portions of the ceramics substrate. In this way, it is possible to reduce the warping of the entire ceramics substrate. This makes the cutting of the sealing resin layer easy in the following step where the sealing resin layer is cut along the cut portions of the ceramics substrate, and thus can alleviate a decrease in cutting yield. By use of the above-described manufacturing method, it is possible to miniaturize a module.

In the method of manufacturing a module according to the first aspect of the invention described above, it is preferable that a step of preparing a supporting member and a step of fixing the ceramics substrate on the supporting member prior to the step of mounting the electronic component be further included. The step of cutting the ceramics substrate includes a step of cutting the ceramics substrate and part of the supporting member from a surface of the ceramics substrate to midway into the thickness of the supporting member in a thickness direction of the ceramics substrate by use of a dicing saw. In this way, it is possible to make division of the supporting member less likely, and accordingly, even if the ceramics substrate is cut before the electronic components are sealed with the sealing resin layer, division of the cut ceramics substrate can be made less likely. For this reason, after the cutting of the ceramics substrate, the sealing resin layer can easily be formed to cover the upper and sides surfaces of the cut ceramics substrate.

In the method of manufacturing a module according to the first aspect of the invention described above, the step of cutting the ceramics substrate may include a step of cutting the ceramics substrate with a first cutting width, and the step of cutting the sealing resin layer may include a step of cutting the sealing resin layer with a second cutting width smaller than the first cutting width.

In the method of manufacturing a module according to the first aspect of the invention described above, the step of cutting the ceramics substrate may include a step of cutting the ceramics substrate with a first cutting width, and the step of cutting the sealing resin layer may include a step of cutting the sealing resin layer with a second cutting width substantially equal to or larger than the first cutting width.

In the method of manufacturing a module according to the first aspect of the invention described above, it is preferable that the step of mounting the electronic component include a step of mounting a plurality of electronic components in each of the plurality of mounting regions. In this way, it is possible to alleviate a decrease in cutting yield, and to obtain a module with high functionality.

In this case, the plurality of electronic components include at least a semiconductor integrated circuit element, a resistor element, an inductor element, or a capacitor element.

In the method of manufacturing a module according to the first aspect of the invention described above, it is preferable that the ceramics substrate be formed out of a ceramics multilayer board. In this way, it is possible to alleviate a decrease in cutting yield, and in addition, good element characteristics can be obtained at the time of mounting of high-frequency integrated circuit elements.

In the method of manufacturing a module according to the first aspect of the invention described above, it is preferable that the sealing resin layer be made of a resin material based on epoxy.

A module according to a second aspect of the invention includes: a ceramics substrate with a wiring layer formed thereon; an electronic component mounted on an upper surface of the ceramics substrate; and a sealing resin layer covering the upper surface of the ceramics substrate so as to seal the electronic component and to cover at least part of side faces of the ceramics substrate.

The module according to the second aspect of the invention can be manufactured by employing the method of manufacturing a module according to the first aspect described above, and thus it is possible to reduce the warping in the ceramics substrate and to obtain satisfactory cut surfaces. In the structure described above, the sealing resin layer is formed such that it covers the upper surface of the ceramics substrate to seal the electronic components and that it covers at least part of the side faces of the ceramics substrate; thus it is possible to effectively make exfoliation of the sealing resin layer less likely.

In the module according to the second aspect described above, preferably, as the electronic component, a plurality of electronic components are mounted on the upper surface of the ceramics substrate, and the plurality of electronic components are electrically connected to one another via the wiring layer so as to function as an integrated circuit. With this structure, it is possible to reduce the warping in the ceramics substrate, to obtain satisfactory cut surfaces, and it is possible to realize a module with high functionality.

In this case, the plurality of the electronic components may include at least a semiconductor integrated circuit element, a resistor element, an inductor element, or a capacitor element.

In the module according to the second aspect described above, preferably, the ceramics substrate is formed out of a ceramics multi-layer board. With this structure, in addition to the effects described above, good element characteristics can be obtained at the time of mounting of high-frequency integrated circuit elements.

In the module according to the second aspect described above, it is preferable that the sealing resin layer be made of a resin material based on epoxy.

As discussed above, according to the present invention, it is possible to obtain a method of manufacturing a module that can alleviate a decrease in cutting yield.

Furthermore, according to the present invention, it is possible to obtain a module having satisfactory cut surfaces with reduced warping in a ceramics substrate.

BRIEF DESCRIPTION OF THE DRAWINGS

FIG. 1 is an overall perspective view illustrating a module according to a first embodiment of the invention with part of the module see-through.

FIG. 3 is a sectional, perspective view illustrating a module according to the first embodiment with part of the module see-through.

FIG. 11 is a sectional, perspective view illustrating a module according to a second embodiment with part of the module see-through.

DETAILED DESCRIPTION OF PREFERRED EMBODIMENTS

Embodiments of the present invention will be described below in detail with reference to the accompanying drawings.

The First Embodiment

Figure 1:
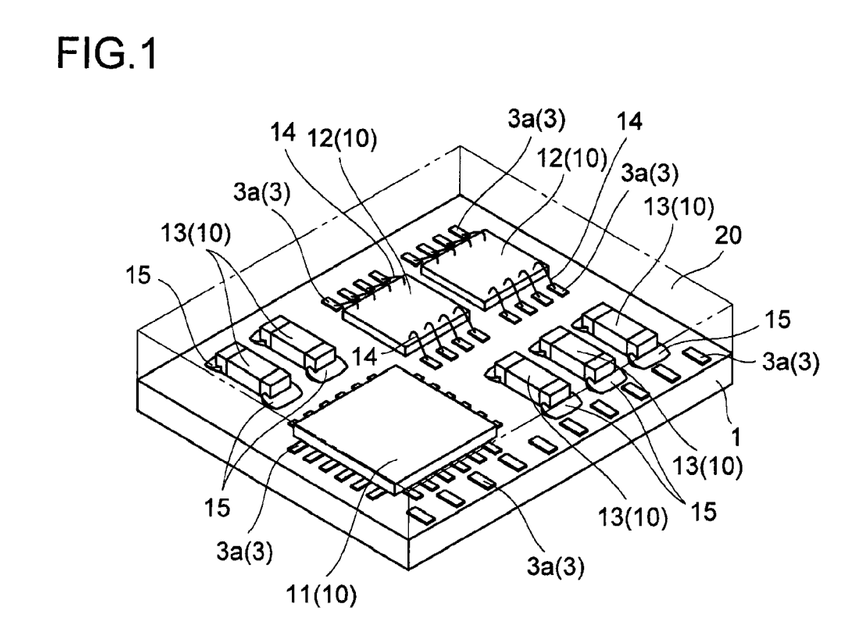
Figure 2:
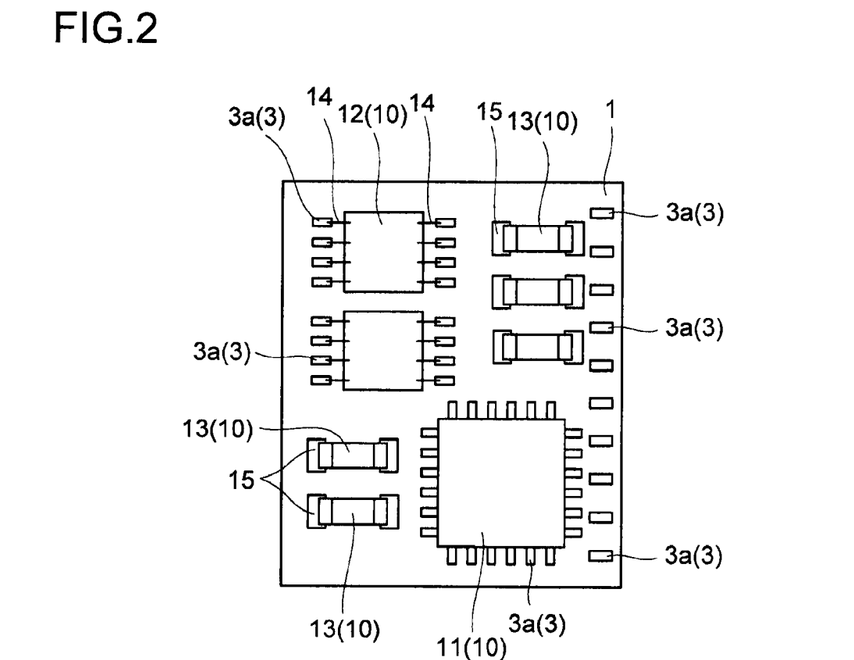
FIG. 2 is a plan view illustrating a module according to first embodiment of the invention with a sealing resin layer omitted.
Figure 3:
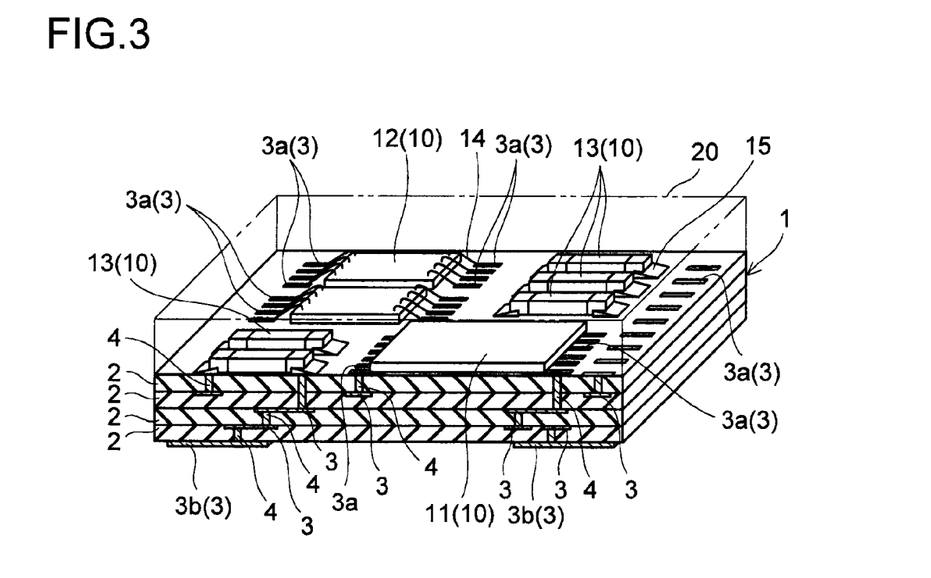

FIG. 1 is an overall perspective view illustrating a module according to a first embodiment of the invention with part of the module see-through. FIG. 2 is a plan view illustrating the module according to the first embodiment of the invention with a sealing resin layer omitted. FIG. 3 is a perspective, cross-sectional view illustrating the module according to the first embodiment of the invention with part of the module see-through. First, a description will be given of the structure of the module according to the first embodiment of the invention with reference to FIGS. 1 to 3.

In the module according to the first embodiment, as shown in FIGS. 1 and 2, a plurality of electronic components 10 are mounted on an upper surface of a wiring board 1, and a sealing resin layer 20 for protecting these electronic components 10 is formed on the upper surface of the wiring board 1.

The wiring board 1 is, as shown in FIG. 3, formed out of a ceramics multi-layer board composed of a plurality of ceramics insulating layers 2 laid on one another. On the surfaces of these ceramics insulating layers 2, there are provided wiring layers (conductors) 3 that are made of Ag (silver), Cu (copper), or the like and that are formed into predetermined wiring patterns. An upper wiring layer 3 and a lower wiring layer 3 are electrically connected with each other through via holes 4, at predetermined positions. On the obverse surface (top face) of the wiring board 1, there is formed a surface wiring layer (surface conductor) 3a (3) which is electrically connected to the electronic components 10 mounted there. On the other hand, on the reverse surface (bottom face) of the wiring board 1, there are formed terminal electrodes 3b (3) to serve as external connection electrodes. The surfaces of the surface wiring layer 3a and the terminal electrodes 3b are plated with Au (gold) or the like. Note that the wiring board 1 is one example of a "ceramics substrate" according to the invention.

The plurality of the electronic components 10 mounted on the wiring board 1 include semiconductor integrated circuit elements such as a flip-chip IC 11 and bare chip ICs 12, passive elements 13 such as resistor elements, inductor elements, capacitor elements, etc. These electronic components 10 are mounted on predetermined regions on the wiring board 1, and are thereby electrically connected to one another via the wiring layers 3 and the via holes 4. Thus, a kind of integrated circuit is composed of the plurality of above-described electronic components. The electronic components 10 composing an integrated circuit are electrically connected, via the wiring layers 3 and the via holes 4, with the terminal electrodes 3b formed on the rear surface of the wiring board 1. As shown in FIGS. 1 to 3, the flip-chip IC 11 is flip-chip-mounted on the surface wiring layer 3a, and the bare chips IC 12 are electrically connected to the surface wiring layer 3a via bonding wires 14. Passive elements 13 are electrically connected with the surface wiring layer 3a via a solder layer 15.

The sealing resin layer 20 is formed of, for example, a thermosetting resin based on epoxy resin. The sealing resin layer 20 resin-seals the electronic components 10 and the surface wiring layer 3a, and thus has a function of protecting the electronic components 10 and the surface wiring layer 3a.

FIGS. 4 to 10 are drawings illustrating a method of manufacturing the module according to the first embodiment of the invention. Note that part of the components are omitted in FIG. 5, and FIGS. 7 to 10 to simplify the drawings. Next, a description will be given of the method of manufacturing the module according to the first embodiment of the invention with reference to FIG. 1 and FIGS. 4 to 10.

Figure 4:
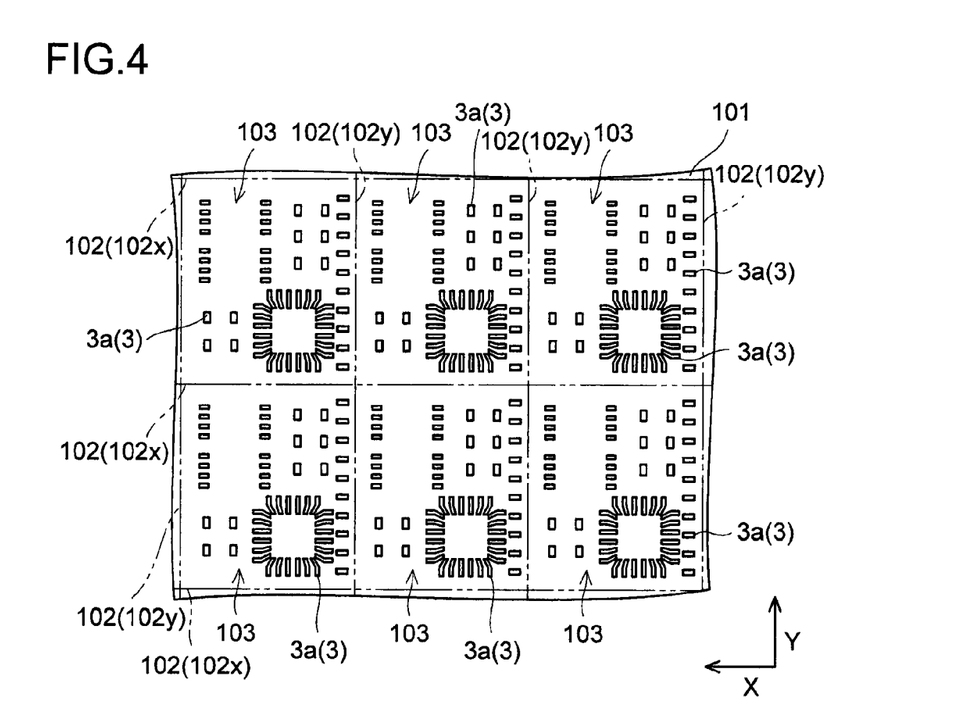
FIG. 4 is a plan view illustrating a method of manufacturing a module according to the first embodiment of the invention.

First, a wiring board 101 as shown in FIG. 4 is prepared. The wiring board 101 has a plurality of mounting regions 103 on its upper surface, each mounting region enclosed by cutting lines 102 (102x) along the X direction and cutting lines 102 (102y) along the Y direction perpendicular to the X direction. Note that the wiring board 101 described above corresponds to a mounting region 103 part enclosed by cutting lines 102. That is, when the wiring board 101 is cut along the cutting lines 102 and is divided into each mounting region 103, a plurality of wiring boards 1 (see FIG. 1) are obtained which are formed of ceramics multi-layer board as described above.

Figure 5:
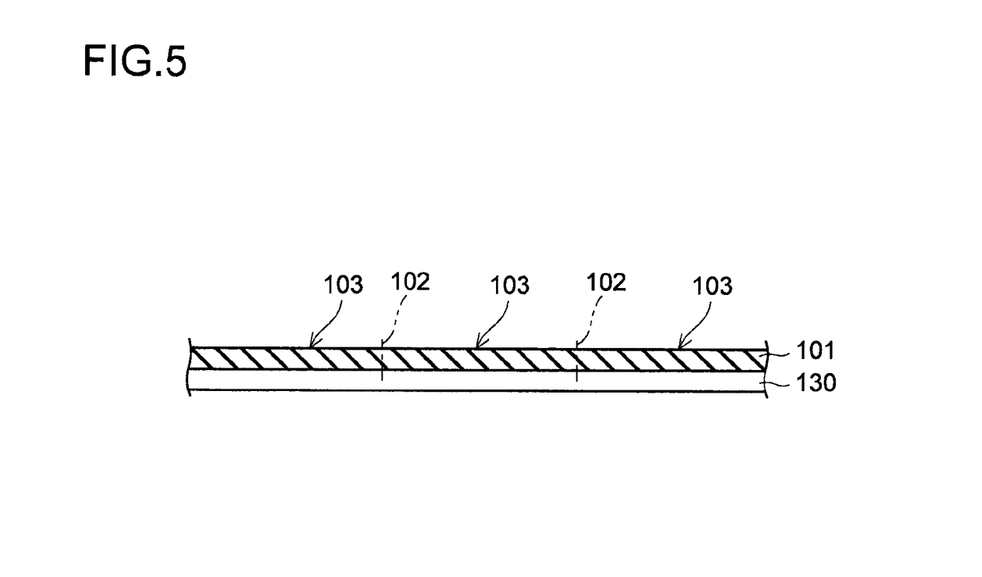
FIG. 5 is a sectional view illustrating a method of manufacturing a module according to the first embodiment of the invention.
Figure 6:
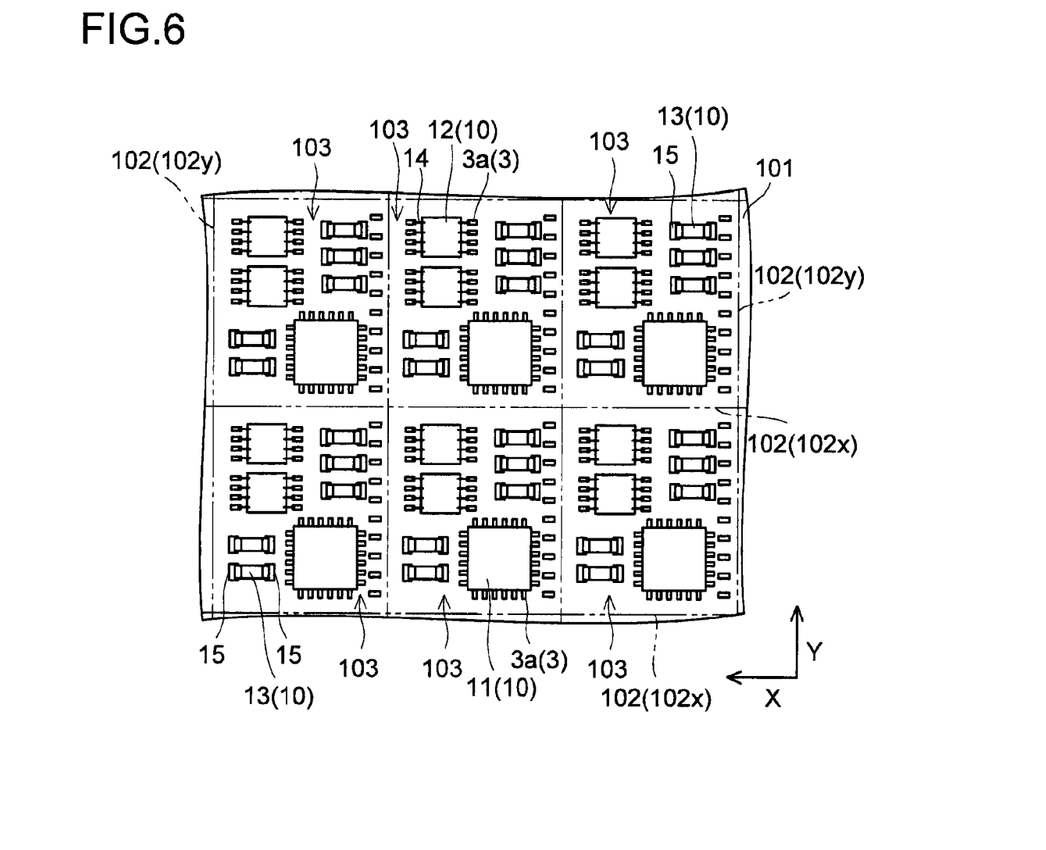
FIG. 6 is a plan view illustrating a method of manufacturing a module according to the first embodiment of the invention.
Figure 7:
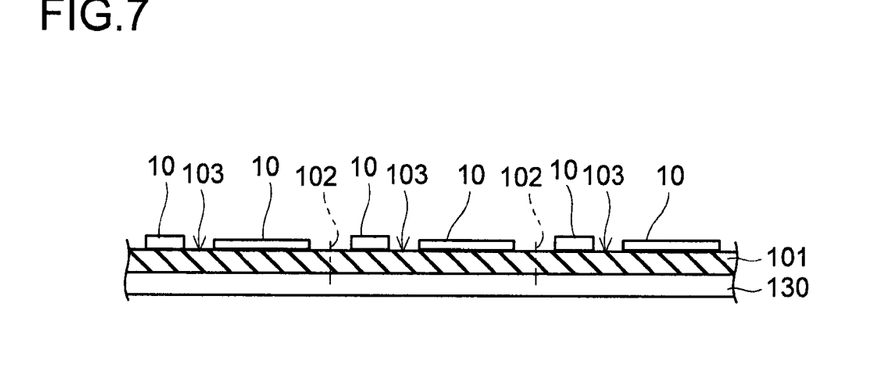
FIG. 7 is a sectional view illustrating a method of manufacturing a module according to the first embodiment of the invention.

Next, as shown in FIG. 5, the wiring board 101 is fixed on a film member 130 with a specific thickness. Then, as shown in FIGS. 6 and 7, a plurality of electronic components 10 are mounted on the corresponding mounting regions 103 on the wiring board 101. Here, each of the electronic components 10 is electrically connected with the surface wiring layer 3a (see FIG. 4) of the wiring board 101 via a solder layer 15, bonding wires 14, etc. The wiring board 101 is one example of a "ceramics substrate" and a "ceramics multi-layer board" according to the invention, and the film member 130 is one example of a "supporting member" according to the invention.

Figure 8:
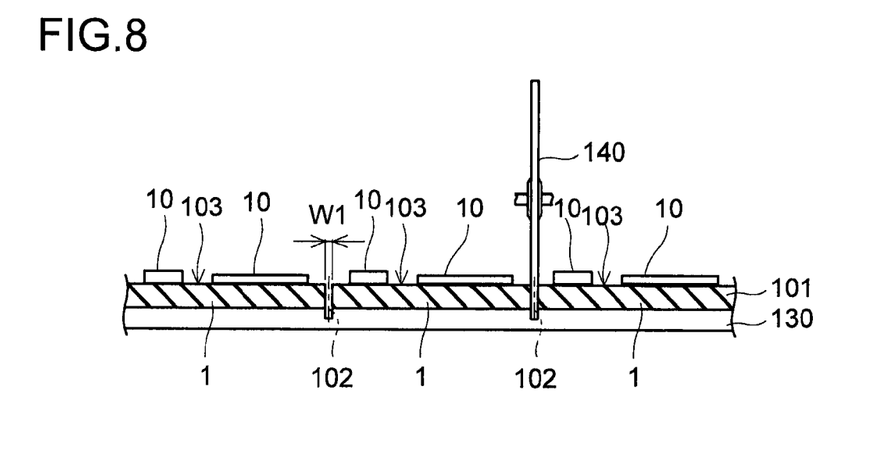
FIG. 8 is a sectional view illustrating a method of manufacturing a module according to the first embodiment of the invention.

Here, in the first embodiment, as shown in FIG. 8, before a sealing resin layer 120, which will be discussed later, is formed on the wiring board 101, the wiring board 101 is cut along the cutting lines 102 using a dicing saw 140. In doing so, in order not to cut (divide) the film member 130 on which the wiring board 101 is fixed, the dicing saw 140 is held sunk midway into the thickness of the film member 130 in the thickness direction of the wiring board 101. In this way, the wiring board 101 along with the film member 130 on which it is fixed, is divided into each mounting region 103. The state of the wiring board 101 after being cut will be the state of the wiring boards 1 described above arrayed in a matrix.

In the first embodiment, cutting of the wiring board 101 with the dicing saw 104 is performed with a predetermined cutting width (first cutting width) w1, such that after the cutting is performed, the space between adjacent wiring boards 1 has the distance w1.

Figure 9:
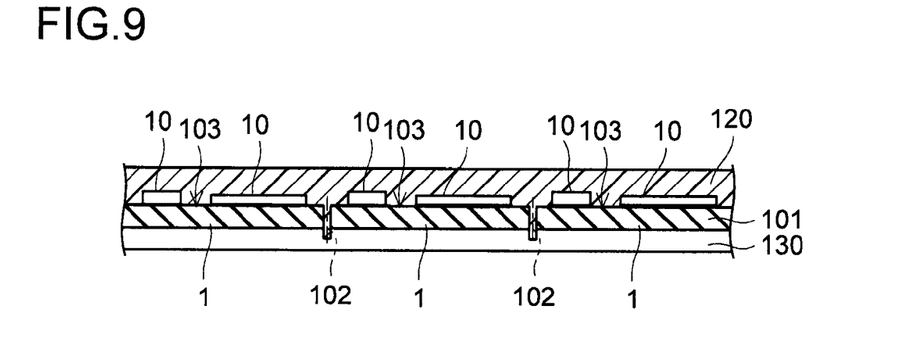
FIG. 9 is a sectional view illustrating a method of manufacturing a module according to the first embodiment of the invention.

Then, as shown in FIG. 9, so as to cover the upper and sides surfaces of the cut wiring board 101, a sealing resin layer 120, made of a thermosetting resin based on epoxy, is formed on (to coat) the entire surface of the cut wiring board 101, and by heating it to a predetermined temperature, the sealing resin layer 120 is hardened. In this way, the electronic components 10 and the surface wiring layer 3a are resin-sealed by the sealing resin layer 120.

Figure 10:
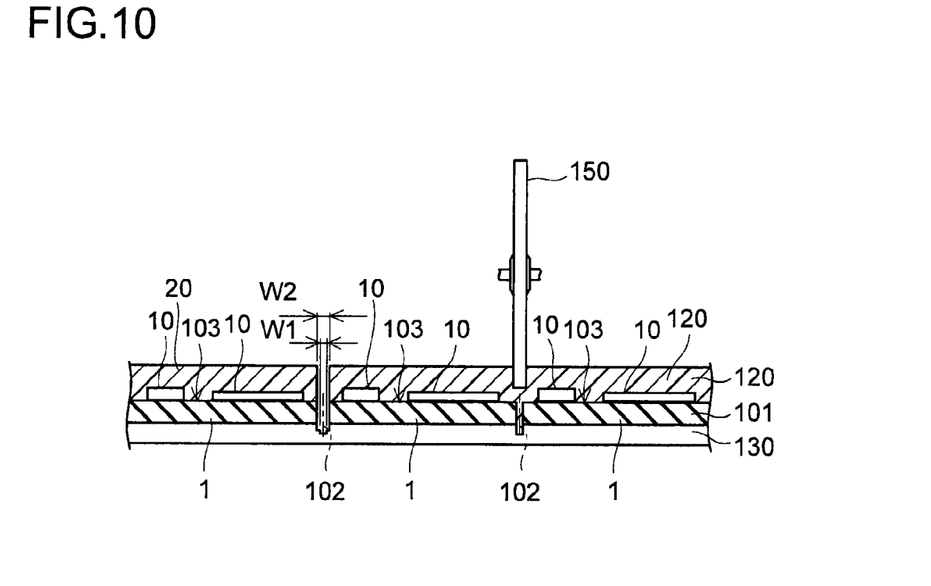
FIG. 10 is a sectional view illustrating a method of manufacturing a module according to the first embodiment of the invention.

After that, as shown in FIG. 10, the sealing resin layer 120 is cut along the cut portions (cutting lines 102) of the cut wiring board 101 with a dicing saw 150. In doing so, the dicing saw 150 is held sunk midway into the thickness of the film member 130 in the thickness direction of the wiring board 101. The cutting of the sealing resin layer 120 with the dicing saw 150 is performed with a cutting width (second cutting width) w2 larger than the cutting width (first cutting width) w1 of the cut portions of the wiring board 101. Thus, the side faces of the wiring board 101 (1) are partly cut at the time of the cutting of the sealing resin layer 120, and divided into individual pieces with the sealing resin layer 120 formed only on the upper surface of the wiring board 101 (1). Each of these individual pieces of the sealing resin layer 120 becomes the sealing resin layer 20 (see FIG. 1) described above.

In the manner described above, the module according to the first embodiment of the invention shown in FIG. 1 is manufactured.

With the method of manufacturing a module according to the first embodiment of the invention, as described above, the electronic components 10 are mounted in the mounting regions 103 on the wiring board 101, and the wiring board 101 is cut along the cutting lines 102; then, the sealing resin layer 120 is formed such that it covers the upper and sides surfaces of the wiring board 101. Thus, even if, when the sealing resin layer 120 is hardened, the difference between the thermal expansion coefficient of the wiring board 101 and the contraction coefficient of the sealing resin layer 120 causes stress to act on the wiring board 101, the warp resulting from the stress can be distributed among the cut-apart portions (1) of the wiring board 101. In this way, it is possible to reduce the warping of the entire wiring board 101. This makes the cutting of the sealing resin layer 120 easy in the following step where the sealing resin layer 120 is cut along the cut portions (cutting lines 102) of the wiring board 101, and thus can alleviate a decrease in cutting yield.

In the first embodiment, at the time of the cutting of the wiring board 101 with the dicing saw 140, held sunk midway into the thickness of the film member 130, it is possible to make division of the film member 130 less likely, and accordingly, even if the wiring board 101 is cut before the electronic components 10 are sealed with the sealing resin layer 120, division of the cut wiring board 101 can be made less likely. For this reason, after the cutting of the wiring board 101, the sealing resin layer 120 can easily be formed to cover the upper and sides surfaces of the wiring board 101.

In the first embodiment, by manufacturing a module with the manufacturing method discussed above, a module having satisfactory cut surfaces, and with a reduced warp in the wiring board 1, can easily be obtained.

In the first embodiment, by forming the wiring board 1 of the module out of a ceramics multi-layer board, it is possible to alleviate a decrease in cutting yield, and in addition, good element characteristics can be obtained at the time of mounting of high-frequency integrated circuit elements.

The Second Embodiment

Figure 11:
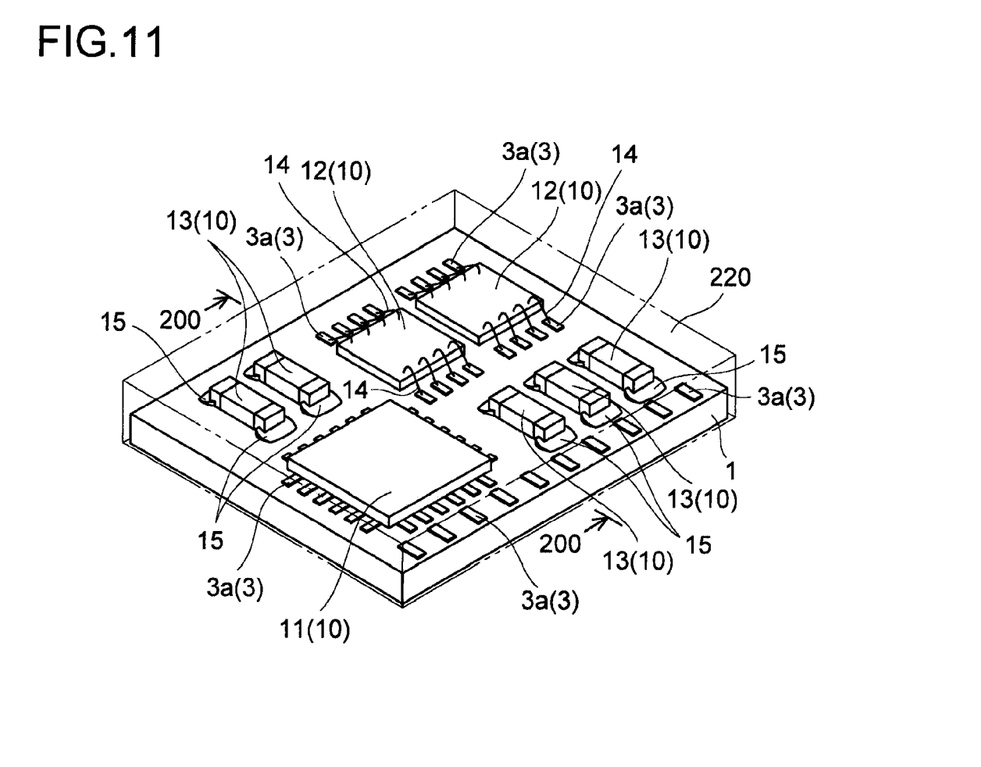
Figure 12:
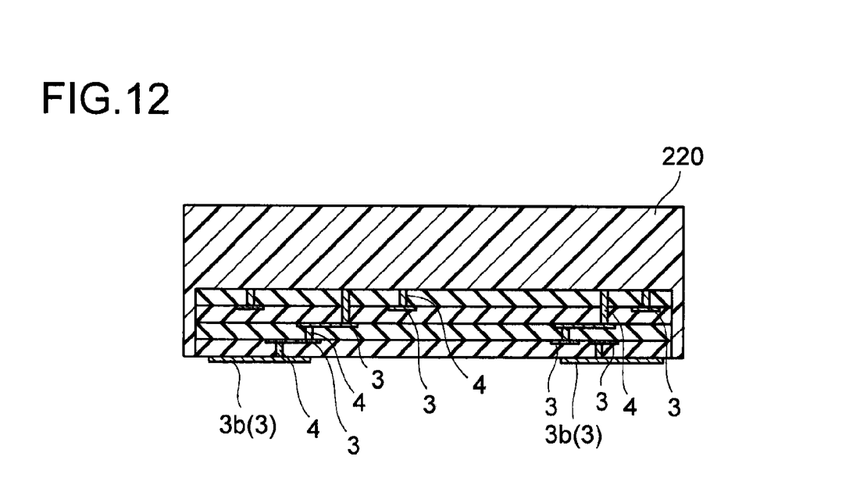
FIG. 12 is a sectional view taken along line 200-200 in FIG. 11.

FIG. 11 is an overall perspective view illustrating a module according to a second embodiment of the invention with part of the module see-through. FIG. 12 is a sectional view taken along line 200-200 in FIG. 11. Next, description will be given on the structure of the module according to the second embodiment of the invention with reference to FIGS. 11 and 12.

In the module according to the second embodiment, as shown in FIGS. 11 and 12, as distinct from the structure of the first embodiment described above, a sealing resin layer 220 is formed such that it covers also the side faces of a wiring board 1.

In the second embodiment, as discussed above, by forming the sealing resin layer 220 such that it covers the side faces of the wiring board 1 as well as the upper surface of the wiring board 1 to seal electronic components 10, it is possible to effectively make exfoliation of the sealing resin layer 220 less likely.

In other respects, the structure and the effects of the module according to the second embodiment are similar to those of the first embodiment.

FIGS. 13 to 16 are sectional views illustrating a method of manufacturing the module according to the second embodiment of the invention. Note that part of the components are omitted in FIGS. 13 to 16 to simplify the drawings. Next, description will be given on the method of manufacturing the module according to the second embodiment of the invention with reference to FIGS. 4 to 7, FIG. 11, and FIGS. 13 to 16.

First, with a manufacturing method similar to that of the first embodiment shown in FIGS. 4 to 7, a wiring board 101 is fixed on a film member 130, and electronic components 10 are mounted on the upper surface of the wiring board 101.

Figure 13:
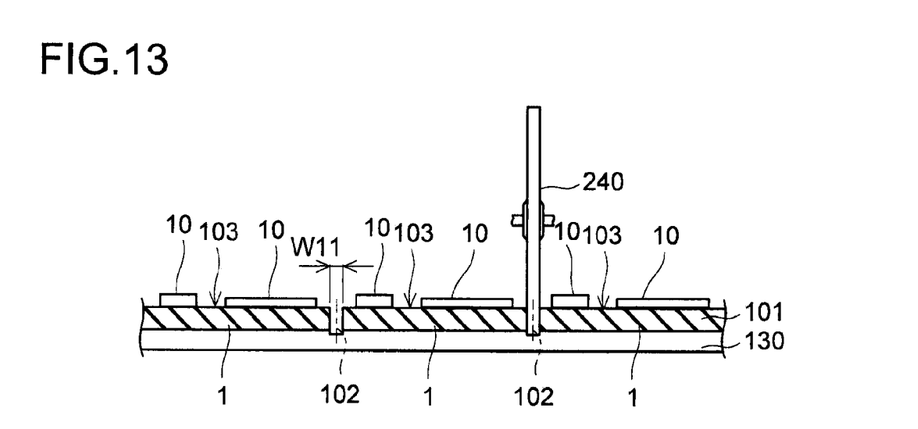
FIG. 13 is a sectional view illustrating a method of manufacturing a module according to the second embodiment of the invention.

Next, as shown in FIG. 13, the wiring board 101 is cut along cutting lines 102 with a dicing saw 240. In doing so, in order not to cut the film member 130 on which the wiring board 101 is fixed, the dicing saw 240 is held sunk midway into the thick ness of the film member 130 in the thickness direction of the wiring board 101. Thus, the wiring board 101 along with the film member 130 on which it is fixed can be divided into each mounting region 103. As in the first embodiment described above, the state of the wiring board 101 after being cut will be the state of the wiring boards 1 described above arrayed in a matrix.

The cutting of the wiring board 101 with the dicing saw 240 is performed with a predetermined cutting width (first cutting width) w11 such that the space between the adjacent wiring boards 1 has the distance w11.

Figure 14:
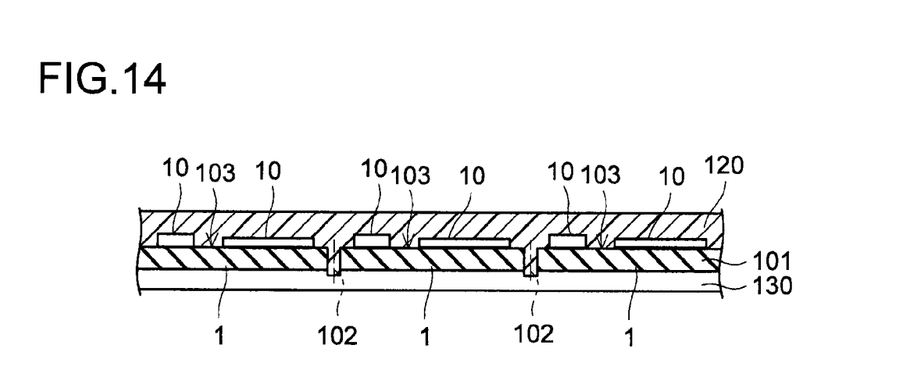
FIG. 14 is a sectional view illustrating a method of manufacturing a module according to the second embodiment of the invention.

Then, as shown in FIG. 14, a sealing resin layer 120 made of a thermosetting resin based on epoxy is formed on the entire surface of the cut wiring board 101 such that the sealing resin layer 120 covers the upper and sides surfaces of the cut wiring board 101, and the sealing resin layer 120 is hardened. In this way, the electronic components are resin-sealed by the sealing resin layer 120.

Figure 15:
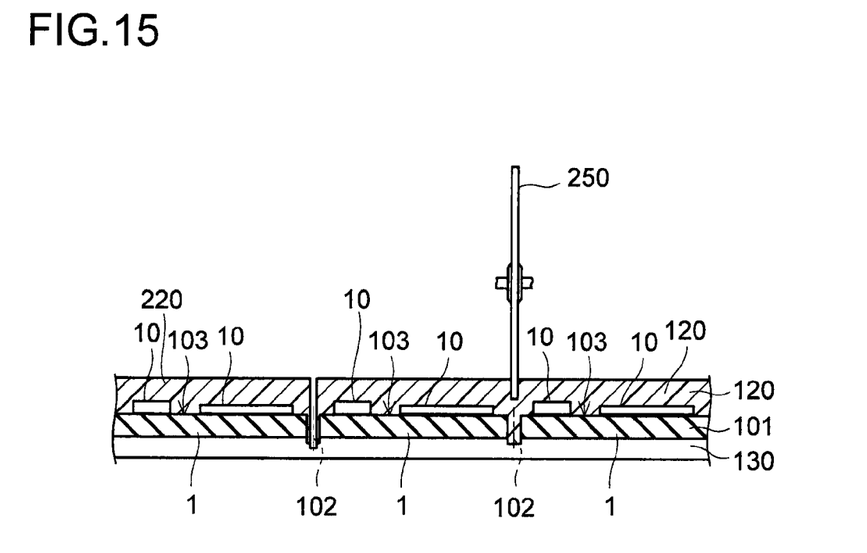
FIG. 15 is a sectional view illustrating a method of manufacturing a module according to the second embodiment of the invention.
Figure 16:
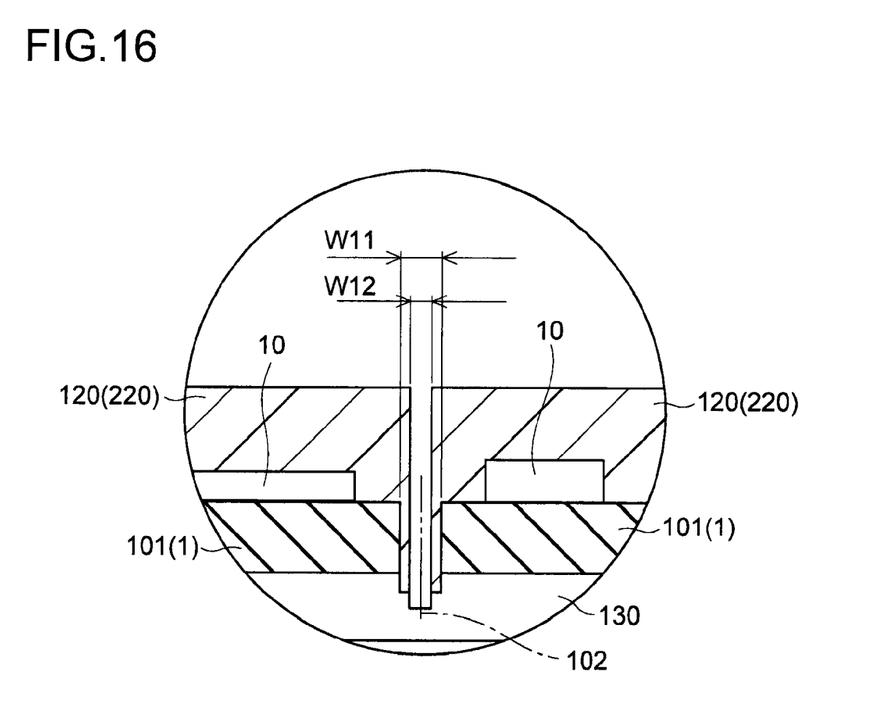
FIG. 16 is a sectional view illustrating a method of manufacturing a module according to the second embodiment of the invention with part of the module enlarged.

Then, as shown in FIG. 15, the sealing resin layer 120 is cut along the cut portions (cutting lines 102) of the cut wiring board 101 with a dicing saw 250. In doing so, the dicing saw 250 is held in a state sunk halfway into the thickness of the film member 130 in the thickness direction of the wiring board 101. As shown in FIG. 16, the cutting of the sealing resin layer 120 with the dicing saw 250 is performed with a cutting width (second cutting width) w12 smaller than the cutting width (first cutting width) w11 of the cut portion of the wiring board 101. In this way, the wiring board 101, along with the sealing resin layer 120, is divided into individual pieces with the side faces of the wiring board 101 covered with the sealing resin layer 120 (220). Note that the individual pieces of the sealing resin layer 120 will each be the sealing resin layer 220 (see FIG. 11) described above.

In the manner described above, the module according to the second embodiment of the invention as shown in FIG. 11 is manufactured.

The effects of the method of manufacturing a module according to the second embodiment are similar to those of the first embodiment described above.

The embodiments disclosed herein are to be considered in all respects as illustrative and not restrictive. The scope of the present invention is set out in the appended claims and not in the description of the embodiments hereinabove, and includes any variations and modifications within the sense and scope equivalent to those of the claims.

For example, although the above-described first and second embodiments deal with an example in which a ceramics multi-layer board is used as a wiring board, this is not meant to limit the invention; it is also possible to use, instead, a ceramics substrate other than a ceramics multi-layer board. For example, a single-sided substrate or a double-sided substrate may be used.

Although the above-described first and second embodiments deal with an example in which a film member is used as an example of a supporting member, this is not meant to limit the invention; it is also possible to use, instead, a supporting member other than a film member.

Although the above-described first and second embodiments deal with an example in which a sealing resin layer made of a thermosetting resin based on epoxy is used, this is not meant to limit the invention; it is also possible to use, instead, a sealing resin layer made of a resin material based on other than epoxy.

Although the above-described first and second embodiments deal with an example in which a dicing saw is used to cut a wiring board and a sealing resin layer, this is not meant to limit the invention; a wiring board and a sealing resin layer may be cut by means other than by using a dicing saw, for example, by laser processing.

Although the above-described first and second embodiments deal with an example in which semiconductor integrated circuit elements such as a flip-chip IC and a bare chip IC, and passive elements such as a resistor element, an inductor element, a capacitor element, etc. are used as electronic components mounted on the wiring board, this is not meant to limit the invention; it is also possible to mount on a wiring board, instead, active elements such as a transistor, etc. Furthermore, there are no particular limitations on the number and the kind of electronic components mounted on the wiring board.

Although the above-described first and second embodiments deal with an example in which a method of manufacturing a module involves first fixing a wiring board on a film member and then mounting electronic components on the wiring board, this is not meant to limit the invention; it is also possible to first mount electronic components on a wiring board and then fix the wiring board on a film member.

Although the above-described first embodiment deals with an example in which a sealing resin layer is cut with a cutting width (second cutting width) larger than a cutting width (first cutting width) of a wiring board, this is not meant to limit the invention; the first cutting width and the second cutting width may be equal.

What is claimed is:

1. A method of manufacturing a module, the method comprising:
    a step of mounting, on a ceramics substrate having on an upper surface thereof a plurality of mounting regions enclosed by cutting lines, an electronic component in each of the mounting regions;
    a step of cutting the ceramics substrate along the cutting lines from an upper surface of the ceramics substrate on which the electronic component is mounted, and dividing the ceramics substrate into each of the mounting regions;
    a step of forming a sealing resin layer, after the step of cutting the ceramics substrate, so as to seal the electronic component and to cover at least part of upper and side surfaces of the cut ceramics substrate; and
    a step of cutting the sealing resin layer disposed on the upper surface of the ceramics substrate along cut portions of the cut ceramics substrate,
    the method further comprising a step of fixing the ceramics substrate on a previously prepared supporting member prior to the step of cutting the ceramics substrate,
    wherein the step of cutting the ceramics substrate includes a step of cutting the ceramics substrate and the supporting member from a surface of the ceramics substrate to midway into the thickness of the supporting member in a thickness direction of the ceramics substrate.

2. The method of manufacturing a module according to claim 1,
    wherein
        the step of cutting the ceramics substrate includes a step of cutting the ceramics substrate with a first cutting width, and
        the step of cutting the sealing resin layer includes a step of cutting the sealing resin layer with a second cutting width smaller than the first cutting width.

3. The method of manufacturing a module according to claim 1,
    wherein
        the step of cutting the ceramics substrate includes a step of cutting the ceramics substrate with a first cutting width, and
        the step of cutting the sealing resin layer includes a step of cutting the sealing resin layer with a second cutting width substantially equal to or larger than the first cutting width.

4. The method of manufacturing a module according to claim 1, wherein the step of mounting the electronic component includes a step of mounting a plurality of electronic components in each of the plurality of mounting regions.

5. The method of manufacturing a module according to claim 4, wherein the plurality of electronic components include at least a semiconductor integrated circuit element, a resister element, an inductor element, or a capacitor element.

6. The method of manufacturing a module according to claim 1, wherein the ceramics substrate is formed out of a ceramics multi-layer board.

7. The method of manufacturing a module according to claim 1, wherein the sealing resin layer is made of a resin material based on epoxy.

* * * * *